US008791695B2

(12) United States Patent
Balcom et al.

(10) Patent No.: US 8,791,695 B2
(45) Date of Patent: Jul. 29, 2014

(54) MAGNETIC RESONANCE APPARATUS AND METHOD

(75) Inventors: Bruce Balcom, Fredericton (CA); Derrick Green, Fredericton (CA); Hui Han, Fredericton (CA)

(73) Assignee: University of New Brunswick, Fredericton, New Brunswick (CA)

( * ) Notice: Subject to any disclaimer, the term of this patent is extended or adjusted under 35 U.S.C. 154(b) by 372 days.

(21) Appl. No.: 12/605,123

(22) Filed: Oct. 23, 2009

(65) Prior Publication Data

US 2011/0050223 A1    Mar. 3, 2011

Related U.S. Application Data

(60) Provisional application No. 61/238,554, filed on Aug. 31, 2009.

(51) Int. Cl.
| | |
|---|---|
| *G01V 3/00* | (2006.01) |
| *G01V 3/18* | (2006.01) |
| *G01R 33/30* | (2006.01) |
| *G01R 33/565* | (2006.01) |
| *G01R 33/44* | (2006.01) |
| *G01R 33/24* | (2006.01) |
| *G01R 33/48* | (2006.01) |

(52) U.S. Cl.
CPC ............ *G01R 33/305* (2013.01); *G01R 33/243* (2013.01); *G01R 33/56518* (2013.01); *G01R 33/4816* (2013.01)
USPC ............... 324/307; 324/303; 324/309; 702/8; 702/9

(58) Field of Classification Search
CPC ...................... G01V 3/00–3/22; G01N 24/081
USPC ................................ 324/300–322; 702/8–18
See application file for complete search history.

(56) References Cited

U.S. PATENT DOCUMENTS

| | | | | |
|---|---|---|---|---|
| 4,827,761 | A | * | 5/1989 | Vinegar et al. ..................... 73/38 |
| 4,920,316 | A | * | 4/1990 | Egloff ............................ 324/318 |
| 5,545,994 | A | * | 8/1996 | Barbara ......................... 324/315 |
| 5,545,998 | A | * | 8/1996 | Favre et al. .................... 324/321 |
| 5,574,370 | A | * | 11/1996 | Woelk et al. .................... 324/320 |
| 5,610,521 | A | * | 3/1997 | Zou et al. ....................... 324/318 |
| 5,689,187 | A | * | 11/1997 | Marek et al. ................... 324/318 |
| 6,507,191 | B1 | | 1/2003 | Eguchi et al. |
| 6,971,260 | B2 | | 12/2005 | Potter |
| 7,138,802 | B2 | * | 11/2006 | Morita et al. ................. 324/318 |

(Continued)

FOREIGN PATENT DOCUMENTS

| | | |
|---|---|---|
| CA | 2600990 A1 | 3/2009 |
| WO | 2010003237 A1 | 1/2010 |

OTHER PUBLICATIONS

Goodyear, D. J. et al., Single point measurements of magnetic field gradient waveform, Journal of Magnetic 2 Resonance, vol. 163, 2003, pp. 1-7.*

(Continued)

*Primary Examiner* — Melissa Koval
*Assistant Examiner* — Emily Chan
(74) *Attorney, Agent, or Firm* — Eugene F. Derényi; Fogler, Rubinoff LLP (57) ABSTRACT

An apparatus and method for performing nuclear magnetic resonance (NMR) or magnetic resonance imaging (MRI) on samples in metallic holders and vessels or in proximity to metallic objects is disclosed.

7 Claims, 8 Drawing Sheets

(56) References Cited

U.S. PATENT DOCUMENTS

| | | | | |
|---|---|---|---|---|
| 7,352,179 | B2* | 4/2008 | Chen et al. | 324/303 |
| 7,940,043 | B2* | 5/2011 | Gao et al. | 324/303 |
| 2004/0004478 | A1* | 1/2004 | Hofmann et al. | 324/321 |
| 2007/0038076 | A1* | 2/2007 | Osada et al. | 600/420 |
| 2009/0256562 | A1* | 10/2009 | Gao et al. | 324/308 |
| 2014/0091800 | A1* | 4/2014 | Fordham | 324/321 |

OTHER PUBLICATIONS

Carbon-13 NMR of Carbon Monoxide. I. Pressure Dependence of Translational Motion in β-CO; Eiichi Fukushima, A.A.V. Gibson and T.A. Scott, The Journal of Chemical Physics, vol. 66, No. 11, Jun. 1, 1977, pp. 4811-4817.

Fixed Field Gradient NMR Diffusion Measurements Using Bessel Function Fits to the Spin-Echo Signal; D.M. Lamb, P. J. Grandinetti and J. Jonas, Journal of Magnetic Resonance 72, 532-539 (1987).

Nuclear Magnetic Resonance Measurements at High Pressure; J. Jonas—The Review of Scientific Instruments, vol. 43, No. 4, Apr. 1792, pp. 643-649.

High-Temperature-High-Pressure NMR Probe for Self-Diffusion Measurements in Molten Salts; U. Matenaar, J. Richter, and M.D. Zeidler—Journal of Magnetic Resonance, Series A 122, 72-75 (1996) Article No. 0177.

N. De Zanche, et al., Advances in NMR Probe Technology for Magnetic Field Monitoring, in "proc., ISMRM, 14th Annual Meeting", (2006) 781.

F. Wiesinger, et al., Magnetic Field Monitoring for Improved Phase Contrast Flow Quantification, in "proc., ISMRM, 16th Annual Meeting", (2008) 392.

F. Wiesinger, et al., Magnetic Field Monitored Autofocus Deblurring for Improved Non-Cartesian Imaging, in "proc., ISMRM, 16th Annual Meeting", (2008) 790.

USPTO Office Action dated Apr. 5, 2013 for U.S. Appl. No. 13/003,509.

J. Jonas and A. Jonas, "High-Pressure NMR Spectroscopy of Proteins and Membranes", Annu. Rev. Biophys. Biomol. Struct. 1994, 23: 287-318.

Jiri Jonas, "High-Pressure NMR Studies of Chemical and Biochemical Systems", High Pressure Chemistry, Biochemistry and Materials Science,1993, vol. 401: 393-441, 1993 Kluwer Academic Publishers, Netherlands.

Jiri Jonas, "Nuclear Magnetic Resonance at High Pressure", Science, Jun. 11, 1982, vol. 216, No. 4551, 1179-1184.

Sprengers et al, "High-Pressure NMR Spectroscopy: Some General Aspects and Applications", High Pressure Effects in Chemistry, Biology, and Materials Science, 2002, vol. 208-2, pp. 283-294, Scitec Publications Ltd., Zurich.

Grunwaldt et al, "Supercritical Fluids in Catalysis: Opportunities of in Situ Spectroscopic Studies and Monitoring Phase Behavior", Catalysis Reviews, 2003, vol. 45, No. 1, pp. 1-96.

Behr et al, "High-pressure autoclave for multipurpose nuclear magnetic resonance measurements up to 10 MPa", Review of Scientific Instruments, vol. 70, No. 5, May 1999, pp. 2448-2453.

S. Gaemers and C. J. Elsevier, "Reducing the NMR line widths of quadrupole nuclei by employing supercritical solvents", Chem. Soc. Rev., 1999, 28, 135-141.

Istvan T. Horvath and John M. Miuar, "NMR under High Gas Pressure", Chem. Rev. 1991. 91. 1339-1351.

Yamada et al, "Pressure-resisting cell for high-pressure, high-resolution nuclear magnetic resonance measurements at very high magnetic fields", Rev. Sci. Instrum., vol. 72, No. 2, Feb. 2001, pp. 1463-1471.

Kremer et al, "The use of high-sensitivity sapphire cells in high pressure NMR spectroscopy and its application to proteins", Spectroscopy 18 (2004) 271-278, IOS Press.

Thurecht et al, "Equilibrium Swelling Measurements of Network and Semicrystalline Polymers in Supercritical Carbon Dioxide Using High-Pressure NMR", Macromolecules 2005, 38, 3731-3737.

Stevens et al, "Measurements of Hydrate Formations in Sandstone", Petrophysics 2008, vol. 49, No. 1, pp. 67-73.

Baldwin et al, "Monitoring hydrate formation and dissociation in sandstone and bulk with magnetic resonance imaging", Magnetic Resonance Imaging 21 (2003) 1061-1069.

Jonas et al, "High-Resolution NMR Spectroscopy at High Pressures", Journal of Magnetic Resonance, Series B, 102, 299-309 (1993).

Morris et al, "Robust spatially resolved pressure measurements using MRI with novel buoyant advection-free preparations of stable microbubbles in polysaccharide gels", Journal of Magnetic Resonance 193 (2008) 159-167.

Baldwin et al, "Using magnetic resonance imaging to monitor CH4 hydrate formation and spontaneous conversion of CH4 hydrate to CO2 hydrate in porous media", Magnetic Resonance Imaging 27 (2009) 720-726.

Hirai et al, "Technical Note—High-pressure magnetic resonance imaging up to 40 MPa", Magnetic Resonance Imaging 18 (2000) 221-225.

Tsushima et al, "Velocity measurement of clay intrusion through a sudden contraction step using a tagging pulse sequence", Magnetic Resonance Imaging 21 (2003) 673-677.

De Zanche et al, "NMR Probes for Measuring Magnetic Fields and Field Dynamics in MR systems", Magnetic Resonance in Medicine 60:176-186 (2008).

Goodyear et al, "Single point measurements of magnetic field gradient waveform", Journal of Magnetic Resonance, vol. 163, Jul. 2003, pp. 1-7.

Deka, K. et al., "Quantitative density profiling with pure phase encoding and a dedicated 1D gradient", Journal of Magnetic Resonance, vol. 178, 2008 pp. 25-32, Available on-line Sep. 26, 2005.

Andris, P. et al., "Magnetic field of RF coil measurement by NMR method", Measurement Science Review, vol. 1, No. 1, 2001, pp. 13-16.

Kennedy, C. B. et al., "Three-dimensional magnetic resonance imaging of rigid polymeric materials using single-point ramped imaging with T1 enhancement (SPRITE)", Can J. Chem, vol. 76, 1998, pp. 1753-1765.

Latta, P. et al., "Single-point imaging with a variable phase encoding interval", Magnetic Resonance Imaging, vol. 26, 2008, pp. 109-116.

ISA/CA, Written Opinion for the International Searching Authority Oct. 7, 2009.

Walter Block, et al., Consistent Fat Suppression with Compensated Spectral-Spatial Pulses, Magn. Reson. Med. 38(2): 198-206, Aug. 1997.

John C. Haselgrove, James R. Moore, Correction for Distortion of Echo-Planar Images Used to Calculate the Apparent Diffusion Coefficient, Magn. Reson. Med. 36(6): 960-964, Dec. 1996.

Anila Lingamneni, et al., Validation of Cine Phase-Contrast MR Imaging for Motion Analysis, J. Magn. Reson. Imaging 5(3): 331-338, May/Jun. 1995.

Graeme F. Mason, et al., A Method to Measure Arbitrary k-Space trajectories for Rapid MR Imaging, Magn. Reson. Med. 38(3), 492-496 , Sep. 1997.

Yantian Zhang, et al., A Novel k-Space Trajectory Measurement Technique, Magn. Reson. Med. 39(6): 999-1004, Jun. 1998.

Jeff H. Duyn, et al., Simple Correction Method for k-Space Trajectory Deviations in MRI, J. Magn. Reson. 132(1): 150-153. May 1998.

Dong-Hyun Kim, Daniel M. Spielman, Reducing Gradient Imperfections for Spiral Magnetic Resonance Spectroscopic Imaging, Magn. Reson. Med. 56(1): 198-203, Jul. 2006.

Peter Latta, et al., Simple Phase Method for Measurement of Magnetic Field Gradient Waveforms, Magn. Reson Imaging 25(9): 1272-1276, Nov. 2007.

Vladimir Jellus, et al., An NMR Technique for Measurement of Magnetic Field Gradient Waveforms, J. Magn. Reson. 162(1): 189-197, May 2003.

Atsushi Takahashi, Terry Peters, Compensation of Multi-Dimensional Selective Excitation Pulses Using Measured k-Space Trajectories, Magn. Reson. Med. 34(3): 446-456, Sep. 1995.

(56) References Cited

OTHER PUBLICATIONS

Marcus T. Alley, et al., Gradient Characterization Using a Fourier-Transform Technique, Magn. Reson. Med. 39 (4): 581-587, Apr. 1998.

Nikolaos G. Papadakis, et al., A General Method for Measurement of the Time Integral of Variant Magnetic Field Gradients: Application to 2D Spiral Imaging, Magn. Reson. Imaging 15(5): 567-578 (1997).

Nicola De Zanche, et al., NMR Probes for Measuring Magnetic Fields and Field Dynamics in MR Systems, Magn. Reson. Med. 60(1): 176-186, Jul. 2008.

Christoph Barmet, et al., Spatiotemporal Magnetic Field Monitoring for MR, Magn. Reson. Med. 60(1): 187-197, Jul. 2008.

D. I. Hoult, R. E. Richards, The Signal-to-Noise Ratio of the Nuclear Magnetic Resonance Experiment, J. Magn. Reson. 213(2): 329-343, Dec. 2011.

D. I. Hoult, The Principle of Reciprocity in Signal Strength Calculations—A Mathematical Guide, Concepts. Magn. Reson. 12(4): 173-187, Jun. 2000.

Timothy L. Peck, et al., Design and Analysis of Microcoils for NMR Microscopy, J. Magn. Reson. B 108(2): 114-124, Aug. 1998.

Meghan Halse, et al., Centric Scan SPRITE Magnetic Resonance Imaging, J. Magn. Reson. 165(2): 219-229, Dec. 2003.

Peter Jezzard, et al., Characterization of and Correction for Eddy Current Artifacts in Echo Planar Diffusion Imaging, Magn. Reson. Med. 39(5): 801-812, May 1998.

T. G. Reese, et al., Reduction of Eddy-Current-Induced Distortion in Diffusion MRI Using a Twice-Refocused Spin Echo, Magn. Reson. Med. 49(1): 177-182, Jan. 2003.

Bernstein, M. A., King, K. F., & Zhou, X. J. (2004). Handbook of MRI Pulse Sequences. N.p.: Elsevier Inc. (cover page and table of contents).

Schmitt, F., Stehling, M. K., & Turner, R. J. (1998). Echo-Planar Imaging. N.p.: Springer-Verlag GmbH (cover page and table of contents).

Mispelter, J., Lupu, M., & Briguet, A. (2006). NMR Probeheads for Biophysical and Biomedical Experiments. N.p.: Imperial College Press. (cover page and table of contents).

T. Onodera, et al., A method of measuring field-gradient modulation shapes. Application to high speed NMR spectroscopic imaging. J. Phys. E: Sci. Instum. 20: 416-419, (1987).

K. P. Pruessmann, et al., Magnetic Field Monitoring during MRI Acquisition Improves Image Reconstruction, in "proc., ISMRM, 13th Annual Meeting", 681 (2005).

\* cited by examiner

MAGNETIC RESONANCE APPARATUS AND METHOD

CROSS REFERENCE TO RELATED APPLICATIONS

This application claims benefit and priority from U.S. Provisional Patent Application Ser. No. 61/238,554 filed Aug. 31, 2009.

FIELD

The present invention relates to magnetic resonance imaging ("MRI") apparatus and methods.

BACKGROUND

MRI apparatus use strong magnetic fields, high power radio frequency ("RF") energy, and rapid precise magnetic field variations to analyse properties of materials. MRI apparatus are commonly used in clinical applications to image body tissue.

MRI has also been used in other fields, notably oil and gas exploration where reservoir rock core samples are analysed to obtain information about the nature of the reservoir being investigated. In the ground, the reservoir rock can be under tremendous pressure and elevated temperatures. It is desirable to reproduce such reservoir conditions when performing tests on reservoir rock core samples. In order to do so, however, the core holder which houses the core sample must be capable of withstanding elevated pressures and temperatures as found in reservoirs.

This presents challenges as to the materials that can be used for the holder. Metal core holders are known which are capable of withstanding elevated pressures and temperatures. Metal core holders, however, block the nuclear magnetic resonance (NMR) signal in the core sample from being detected in the RF probe. In addition, the rapidly switched magnetic field gradients induct currents in the metal called eddy currents. These eddy currents distort the magnetic field and thus distort the resultant magnetic resonance image.

Hardware improvements such as shielded gradient coils and waveform pre-emphasis are largely successful at reducing these effects in modern scanners in the absence of substantial metal structures near the sample space. The residual eddy currents may however still cause image-quality problems including ghosting in EPI, RARE and GRASE imaging pulse sequences, slice-profile modulation with spatial-spectral RF pulses, geometric distortion in diffusion-weighted EPI, and quantitative velocity errors in phase-contrast imaging. Knowledge of the true gradient waveform in the MRI pulse sequence is critical to addressing and remedying such problems. Eddy currents present a particular problem in sample spaces surrounded by or in the vicinity of metals structures.

Numerous methods have been developed to measure MRI gradient waveforms and k-space trajectories. One strategy is magnetic field monitoring (MFM) with RF microprobes. Multiple RF microprobes record the magnetic field evolution associated with a wide variety of imaging pulse sequences.

The MFM method involves exciting the sample and measuring the time evolution of magnetization through the free induction decay (FID). However, the gradient waveform duration is limited by the sample $T_2^*$. The k-space maxima (i.e. maximum temporal gradient area or image resolution) measurable with MFM are also limited by gradient dephasing. In addition, implementation of this technique is relatively complex as it requires careful probe fabrication, an array of at least 3 probes, accurate probe positioning and alignment and a multi-channel receiver.

Core holders made of non-metallic composite materials are also known. Such core holders eliminate the problems associated with using metal but are limited by the pressures and temperatures that they can sustain. The sensitivity of the NMR apparatus is reduced due to the larger RF probe being required to accommodate the holder. For non-gradient NMR techniques like measurements of free induction decays, measurement of $T_2$ and/or $T_1$ compensation of the gradient distortion is not required.

SUMMARY

A solution to building a pressure cell for use with NMR is to move the NMR probe from outside the cell to the inside of the cell. By doing this, the design can use metal (non-magnetic) which becomes part of the electrical circuit of the NMR probe. In addition, the filling factor is greatly improved which dramatically improves the signal-to-noise ratio ("SNR"). The magnetic field gradient will be distorted due to the metal between the gradient coil and the sample but a properly designed MRI pulse sequence can greatly reduce or eliminate the artifacts produced by these distortions. Alternatively, these problems can be overcome with standard SPRITE MRI methods in combination with magnetic field gradient waveform measurements and subsequent waveform correction. Appropriate gradient waveform correction would permit the full array of gradient related MR methods to be employed (SE-SPI, conventional MRI, centric scan SPRITE, diffusion measurements).

According to one aspect, the invention relates to a metal pressure vessel with an RF probe inside.

According to another aspect, the invention relates to a method of using the magnetic field gradient monitor (MFGM) method to measure and correct gradient waveforms distorted by a metal vessel.

According to another aspect, the invention relates to a method of measuring waveforms either inside or outside a metal pressure vessel.

According to another aspect, the invention relates to the use of a metal pressure vessel for an MRI application.

According to another aspect, the invention relates to measuring pipe flow in a pipe apparatus, a core holder implementation or a pressure vessel.

According to another aspect, the invention relates to the use of standard SPRITE images directly without fixing deleterious waveforms where standard SPRITE is used where k space is sampled side to side.

According to another aspect, the invention relates to the use of SPRITE MRI methods to overcome possible static field inhomogenieties associated with metal vessels.

DETAILED DESCRIPTION

Figure 1:
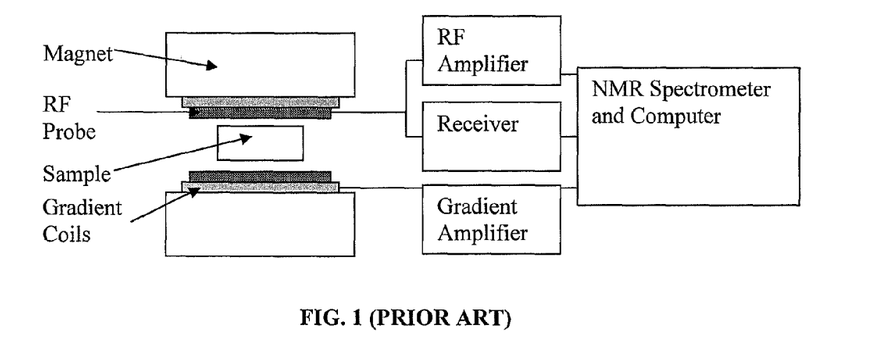
FIG. 1 is a block diagram of a prior art MRI apparatus.

The main hardware components of a typical known MRI apparatus are shown in FIG. 1. The magnet produces the required large homogeneous static magnetic field. The RF probe and RF amplifier produces the required high power RF energy needed to excite the sample. The RF probe and receiver detects the very low level NMR signals following the RF excitation. The probe is a simple resonator that transmits and receives signals at the frequency of the NMR signal (called resonance frequency). The RF probe's sensitivity to the low level NMR signal is directly proportional to the relative volume of the probe to the sample volume. This ratio is called the filling factor. Ideally, one would want this factor to be as close to unity as possible.

The gradient coil and amplifier modifies the static magnetic field in such a way that positional information can be encoded into the detected signal and an image can be created. Typically, the magnetic field is changed linearly in the three spatial directions for three dimensional (3D) images. These magnetic field gradients are applied by using high current amplifiers and properly designed gradient coils. The magnetic field gradients are rapidly switched on and off during what is known as an MRI pulse sequence. The MRI pulse sequence is simply a sequence of RF and gradient pulses.

In core holders embodying the principles of the present invention, materials must be used that allow transmitted RF energy to reach the sample being tested and be uniform across the sample, while withstanding elevated pressures and temperatures as are typically found in underground formations.

Figure 2:
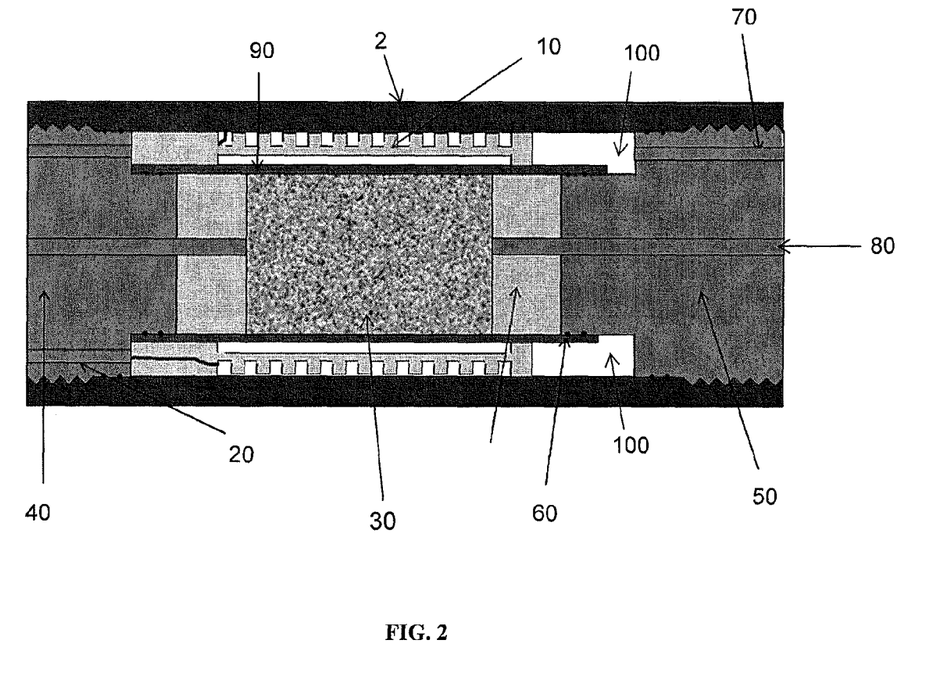
FIG. 2 is a cross-section of a core holder embodying the principles of the present invention.

FIG. 2 depicts a core holder embodying the principles of the present invention. The core holder comprises an outer casing 2 which encloses an NMR probe 10 which in turn encloses a sample 30 being tested. The casing 2 is made of non-magnetic metal with sufficient tensile strength to withstand being pressurized to formation pressures. A variety of metals may be employed, including but not limited to aluminum, non-magnetic stainless steel, brass, and titanium.

Two metal disk-like end plugs, one fixed 40, and the other removable 50, are threaded into the outer case 2. One or more o-rings 60 provide a pressure seal on each end. External connections 70 to the internal void space 100 of the core holder are made with high pressure connections screwed into the end plugs 40, 50.

Access through the end plugs 40, 50 is provided through threaded holes which receive the accessory, fluid inlet/outlet or electrical connection 20 to the NMR probe 10 connection. The NMR probe 10 is tuned and matched with an external tuning box. No moving parts are associated with the NMR probe 10 in the core holder.

A conventional RF shield is not required as the outer case 2 performs this function. Electrical contact is made to the shield through direction connection at the electrical connection 20. Completely enclosing the sample 30 with the casing 2 is very effective and yields a good experimental signal to noise ratio ("SNR").

The probe 10 is a coil of wire which surrounds the sample 30 but any suitable NMR probe design can be used. For example, the probe can be a saddle coil or birdcage in design. The probe 10 is connected by electrical connection 20 to a suitable MRI apparatus (not shown) outside of the casing 2. The NMR probe 10 assembly and electrical connections to the probe in one embodiment are sealed with a two part epoxy or other inert filler material such as a ceramic material or other suitable high pressure connector. A permanent hollow former or removable solid former ensure that the desire sample space inside the NMR probe is not filled with epoxy. If epoxy is used, the epoxy chosen is preferably high strength, impermeable to water and other solvents and makes a tight seal to the roughened internal metal surface of the pressure vessel. The NMR probe electrical contacts are protected from water exposure by the epoxy filler. The epoxy filler is also preferably chosen for short $T_2^*$MR lifetimes. Ideally, the epoxy will have significant thermal conductivity. Radial pressure can be exerted on the sample 30 through the bladder or containment sleeve 90 by pressurizing the internal space 100.

The holder becomes part of the electrical circuit shielding the NMR probe 10 from stray electromagnetic interface. In one embodiment, the holder is pressurized by introducing a fluid into the holder by the inlet opening 70 using a hydraulic hand pump or similar pressurizing means. An access hole 80 in the center of the holder allows fluid to flow to and from the sample 30 under pressure. The containment sleeve 90 isolates the sample 30 from the pressurizing fluid. The sleeve 90, the pressurizing fluid, and all components inside the casing 2 must be made of suitable materials which do not produce an NMR signal. Fluorinated plastics and oils such as polytetrafluoroethylene can be used.

Temperature inside the holder is regulated by circulating a temperature regulated fluid through tubing (not shown) in contact with the exterior of the casing 2. The regulated fluid can be water-based to ensure inexpensive and good heat delivery or removal. The fluid can also be a gas. One need not be concerned about MR/MRI detection of the fluid by the probe 10 as it is inside the casing.

Instead of a regulating fluid, a non-magnetic resistive heating tape can be used to heat a sample in the core holder. Another method for maintaining temperature would be to circulate heated pressurizing fluid in the void space 100.

The probe 10 is surrounded by the pressurizing fluid and thus may need to be calibrated or corrected to obtain accurate calibrated NMR measurements. One method of calibrating the probe 10 is by sending a pulse of radio frequency energy into the probe 10 and measuring its response. This response can be used to correct the NMR signal acquired. An alternative is to use a separate probe outside of the pressurizing fluid.

The type of NMR probe used varies depending on the type of magnet used. For example, the core holder depicted in FIG. 2 can be used with both high field superconducting magnets and low field permanent magnets. In the case of superconducting magnets, the $B_0$ field direction will be parallel to the long axis of the core holder and the probe 10 will generate a $B_1$ field at right angles to the $B_0$ field across core holder.

This type of NMR probe may be chosen from any number of conventional designs. In the case of permanent magnets, the natural geometry will have the RF probe generate a $B_1$ field parallel to the long axis of the cylinder since the $B_0$ field will be transverse. For this geometry, the NMR probe is preferably of the simple solenoid design.

It may be desirable to spin the pressurized cell in a centrifuge to produce a force on the sample contained within. This allows for fluid to be removed or replace in the sample allowing measurement of parameters like capillary pressure and relative permeability. A simple modification to the existing pressure cell described would be to add a collar on one end of the cell so that it may be spun in a centrifuge. This collar could be permanently machined in to the outer case 2 or threaded on to the out case as required. Alternatively the pressure cell could be simply thread directly into a centrifuge rotor.

Another aspect of this invention is a method of evaluating a core sample housed in a metallic core holder such as described above using MRI, including the step of reducing or eliminating distortions of the magnetic field gradient. The presence of the metallic casing 2 introduces deleterious magnetic field gradient waveform effects, e.g. artifacts produced by distortions of the magnetic field gradient, which largely preclude MRI and diffusion measurements. Any distortion of the homogeneity of the static magnetic field in the sample space may be readily measured and evaluated using the SPRITE materials MRI method. This method is robust to field inhomogeneity and will tolerate a significantly inhomogeneous static $B_0$ field.

The standard SPRITE materials MRI methods may be used in combination with magnetic field gradient waveform measurements and subsequent waveform correction. Appropriate gradient waveform correction permits the full array of gradient related MR methods to be employed (SE-SPI, conventional MRI, centric scan SPRITE, diffusion measurements).

Another consequence of the use of a metallic core holder is the generation of eddy currents in the pressure vessel structure in response to switched magnetic field gradients. The experimental eddy currents in continuous metallic cylindrical structures, which are the critical element to a metallic core holder, are very severe and very long-lived. Not only do these eddy currents result in significant linear gradient eddy currents, but they also produce significant $B_0(t)$ shifts. For example, a cylindrical metal core holder will generate severe eddy currents (linear gradient and $B_0(t)$ shifts) with time constants of tens of msec.

Therefore, a method embodying the principles of the present invention comprises the steps of mapping the infidelities in the magnetic field gradient waveform experienced by the sample, as well as determining the $B_0(t)$ shift. Each of these effects is mapped in the sample space. End effects from the core holder end plugs may result in a spatial variation of these eddy current effects. Preferably, the eddy current effects are mapped with the MFGM method as described herein and as described in PCT application no. PCT/CA2009/000944 filed Jul. 8, 2009 which is incorporated herein by reference in its entirety. This method involves a small MR sample and NMR probe which act as a point-like test probe which may be traversed within the sample space.

Two trial gradient waveforms illustrate the advantages of the method of this invention. Neither could be measured by conventional MFM. One illustrates the ability to measure extended duration magnetic field gradient waveforms while the other illustrates the ability to measure magnetic field gradient waveforms with large net gradient area and/or high amplitude (a simple bipolar diffusion gradient waveform, $G_{max}$=250 mT/m, b value approx=100,000 s/mm$^2$).

The RF micro coil utilized is extremely easy to fabricate, compared with MFM RF microprobes. Susceptibility matching for improved static field homogeneity is not an issue. One small probe is sufficient to measure all three gradient axes and a multi-channel receiver is not a prerequisite. The method is a point monitor where the probe location does not need to be exactly known.

The RF micro coil utilized provides a high measurement sensitivity compared to prior art due to the maximized probe filling factor and a stronger $B_1$ field per current unit. Prior art studies have employed a thin uniform cylindrical gel sample. It is however hard to make a thin slice phantom (thickness<3 mm) and position it orthogonal to 3 gradient directions sequentially. The method of this invention does not require phantom movement for 3 dimensional gradient measurements. The method of this invention is a point monitor with simple implementation, low cost hardware requirement but sensitive calibration.

Small NMR Probe for Gradient Monitor

For magnetic field gradient measurements, transverse magnetization dephasing due to the gradient is always an issue. Smaller samples are usually required to limit signal decay due to gradient dephasing. This naturally suggests a correspondingly small RF probe. The method of this invention acquires a single FID point after a short phase encoding time $t_p$ following each RF excitation. In another embodiment, a few FID points can be acquired. Therefore it has a significant advantage against gradient dephasing compared with conventional MFM. Although a true microcoil will work efficiently with this strategy, a small NMR coil (phantom size from mm to a few cm) with simple fabrication is generally suitable.

Pure Phase Encode

Figure 10:
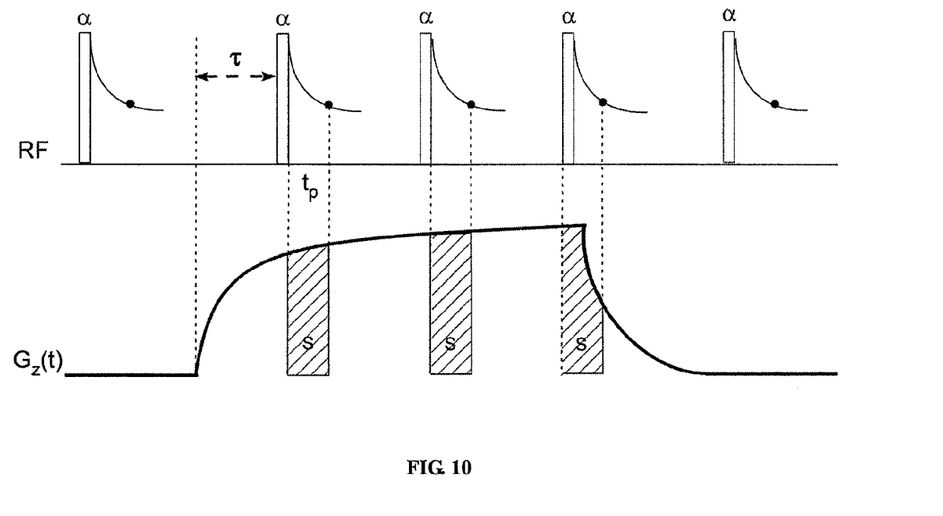
FIG. 10 is a schematic diagram showing a pulse sequence.

The waveform measurement pulse sequence is illustrated in FIG. 10. A series of broadband RF pulses are employed in each execution of the pulse sequence to create transverse magnetization in the presence of the gradient. RF pulses prior to the gradient pulse provide a reference phase. A sample with very short $T_1$, $T_2$ ensures each RF excitation is independent of all other excitations i.e. the sample magnetization will be at equilibrium for each pulse. Following each RF excitation after a fixed duration phase encoding time $t_p$, a single FID point is acquired. Gradient area S can be used to determine the phase for each measurement. With each repetition of this basic measurement sequence, following necessary signal averaging, the time variable τ is incremented. The gradient waveform can thus be measured with high temporal resolution. Multi point detection will also improve the temporal resolution.

With a spherical sample positioned parallel to the axis of magnetic field gradient $G_z$ with an offset $z_0$ relative to the gradient origin, the single point phase is $$\theta = \gamma G_z t_p z_0. \qquad (1)$$

The signal phase is thus a direct measurement of average gradient amplitude $G_z$ during the chosen measurement interval $t_p$.

The analytical 1D Fourier Transformation of a sphere gives the magnitude of the single point:

$$|S_{(k)}| = 2\pi a^3 Sinc(2\pi ka) + \left(\frac{1}{2\pi^2 k^3} - \frac{a^2}{k}\right) Sin(2\pi ka) - \frac{a}{\pi k^2} Cos(2\pi ka), \qquad (2)$$

where k is $\gamma/2\pi G_z t_p$ and a is the radius of sphere. Eq. (2) is a Sinc like function with the first zero crossing at k=0.72/a.

For conventional MFM based on frequency encoding, the highest k is limited by Eq. (2). For a sphere, k must be smaller than 0.72/a to avoid gradient dephasing. Spatial resolution in a common 2D Cartesian k-space image is thus limited to a/1.01. High k-space values correspond to large net gradient areas by definition, $$k = \frac{\gamma}{2\pi} \int_0^t G(t') dt'.$$

For the new method with pure phase encoding, the gradient waveform is measured by decomposing the large gradient area into small separate gradient areas with a short duration $t_p$. Thus for the same sample geometry, the new method can readily measure two orders of magnitude higher k-space compared to conventional MFM. For the same reason the new method can measure gradient amplitudes more than two orders of magnitude greater than for MFM.

Small NMR Probe and Nature of the Sample

Conventional MFM involves exciting the test sample and measuring the time evolution of magnetization through the FID. The duration of the gradient waveform is thus limited by sample $T_2^*$ (i.e. static field inhomogeneity). The limit can be alleviated by fabricating a complex probe with susceptibility matched materials.

The pure phase encode method of this invention measures the gradient waveform through measuring discrete gradient areas. Preferably, a sample with a short $T_2$ (100 μs) is chosen. The sample $T_2^*$ is dominated by the short $T_2$ and thus the probe fabrication is simple and does not require susceptibility matching.

For the pure phase encode gradient monitor, the probe does not have to be micro scale. A larger NMR coil (phantom size from mm up to a few cm) with simple fabrication is adequate for measuring a wide range of gradient amplitudes.

Figure 7:
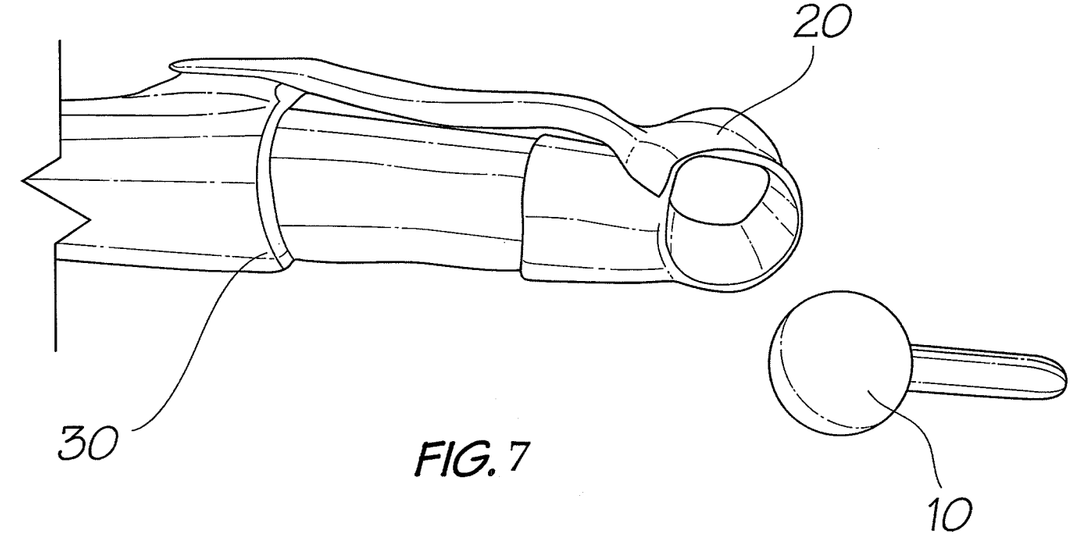
FIG. 7 is a perspective view of an MFGM probe.

In one embodiment shown in FIG. 7, a single turn solenoidal coil 20 is used. The probe can be any vessel suitable for holding a reference (phantom) sample for NMR measurement such as doped water that yields an experimental signal. The RF probe head 20 shown is a single turn solenoid, with cylindrical copper conductor, that is electrically connected to a coaxial cable 30. The embodiment shown in FIG. 7 includes a bulb 10 for containing doped water. A heavily $GdCl_3$ doped water drop ($T_2^*$, $T_2$, $T_1$s=60~100 μs) was syringed into the bulb 10 and flame sealed. It will be understood by those skilled in the art that the doping agent can be any number of paramagnetic metals which function as strong MR contrast agents. The probe was tuned to 100 MHz and capacitively matched with a Q value of 100. The probe was enclosed in an RF shield for measurement. Preferably, the probe is constructed from Teflon and copper and has negligible background signal.

Another probe that can be used is described in the paper of De Zanche et al. "NMR Probes for Measuring Magnetic Fields and Field Dynamics in. MR Systems", Magnetic Resonance in Medicine 60:176-1860 (2008) but it should be understood that magnetic susceptibility matched components need not be used in the probes of the present invention. It will be understood by those skilled in the art that the probes and methods of the present invention are used with conventional NMR apparatus such as described in this application in the examples. The methods of the present invention enable measurement of the true magnetic field gradient waveform of the sample space (including any eddy currents or other distortions present). NMR measurements on the sample can then be corrected using suitable hardware or software to yield improved results.

The larger size sample permits the signal-to-noise ratio (SNR) of the RF receiver coil to be increased significantly since the overall signal is directly proportional to the sample volume. A short sample $T_1$ (100 μs) allows the monitoring probe to continuously pulse during the imaging pulse sequence.

The small size of the test sample and associated RF probe permits the gradient waveform and non-ideal behavior to be spatially resolved inside the MRI sample space, inside the MRI RF probe by simple translation of the point sensor. There is an additional benefit associated with the small RF probe point sensor approach. The gradient waveform measurement should be undertaken in the presence of the MRI RF probe since in many instances the MRI RF probe will support eddy currents. Prior art method [Goodyear, et al. J. Magn. Reson. 163 (2003), 1-7] employed the MRI RF probe for the waveform measurement but this method is vulnerable to background short $T_2^*$ signals from the probe body. The pure phase approach with a dedicated small RF probe avoids the background signal problem since it is relatively easy to eliminate all short $T_2^*$ signal components from the home built probe.

$B_0(t)$ Eddy Current Measurement with MFGM $B_0(t)$ shifts are particularly significant when MRI measurements are to be made in metallic pressure vessels. If $B_e(r, t)$ is the z component of the eddy-current magnetic field that results from pulsing the gradient coils, then a Taylor expansion gives:

$$B_e(r,t) = b_0(t) + r \cdot g(r) \quad (3)$$

The first term is usually called the $B_0$ eddy current. The second term is called the linear eddy current.

In one embodiment of this invention, one MFGM probe is placed at two different locations or an array of two MFGM probes is used with each at a different location to measure $B_{0eddy}(t)$, the $B_0$ eddy current. For MFGM probe samples positioned at location $z_1$ and $z_2$, an offset to the gradient origin along the axis of magnetic field gradient $G_z$, the single point phase for the two cases is:

$$\theta_1 = \gamma G_z(t) z_1 t_p + \gamma B_{0eddy}(t) t_p \quad (4)$$

$$\theta_2 = \gamma G_z(t) z_2 t_p + \gamma B_{0eddy}(t) t_p \quad (5)$$

$B_{0eddy}(t)$ and $G_z(t)$ can thus be solved from the two equations.

In another embodiment, an array of two MFGM probes is used with each at a different location to measure $B_{0eddy}(t)$ and $G_z(t)$ simultaneously.

By analogy, placing one MFGM probe at more than two different locations permits the measurement of $B_{0eddy}(t)$, $G_x(t)$ and $G_y(t)$. Using an array of more than two MFGM probes with each at a different location permits the measurement of $B_{0eddy}(t)$, $G_x(t)$ and $G_y(t)$ simultaneously.

In yet another embodiment of this invention, a multiple FID point method is used to measure $B0(t)$, $G_x(t)$ and $G_y(t)$. This method can be used to largely increase the SNR of experiments through increasing the phase evolution since the phase evolution i.e. $\gamma B_{0eddy}(t) t_p$ caused by $B_0$ eddy current is usually small with a small encoding time $t_p$ and the phase discrimination may not be good. A sample with relatively longer relaxation times ($T_1$, $T_2$, $T_2^*$ >100 μS) can be used instead. An entire FID should be acquired following each RF excitation. The two equations for two probes at two different locations are:

$$\theta_1(t) = \gamma G_z(t) z_1 t + \gamma B_{0eddy}(t) t \quad (6)$$

$$\theta_2(t) = \gamma G_z(t) z_2 t + \gamma B_{0eddy}(t) t \quad (7)$$

$\theta_1(t)$ is the FID point phase following each RF excitation. A linear least square fitting algorithm can be used to extract $B_{0eddy}(t)$ and $G_z(t)$. This method is well suited for clinical MR applications where lower amplitude gradients (<4 G/cm) are usually employed. Because the FID decay following each RF excitation will be dominated by the short $T_2^*$, not by gradient dephasing, a number of FID points following each RF excitation with a good SNR thus should be used in gradient measurement. This multiple FID point strategy can increase the SNR as well as decrease the scan time. It decreases the number of MFGM probes with a probe array for simultaneously monitoring the gradient waveform and $B_0(t)$ during actual imaging acquisition.

A further step involves correcting linear eddy currents with gradient pre-emphasis or regridding. $B_0(t)$ shifts may be corrected in post processing software, or through winding a $B_0$ correcting coil on the pressure cell exterior and pulsing current through this coil to cancel the $B_0(t)$ shift. This assumes at least one gradient amplifier can be devoted to the $B_0(t)$ correcting coil. This is reasonable if limited to 1D and 2D imaging.

In another method embodying the principles of the present invention, eddy currents are measured exterior to the enclosed sample volume with an MFGM probe (outside of the cylindrical vessel). Such measurements may be used to guide eddy current correction. While the sign and amplitude of the gradient and $B_0(t)$ shift will be different, the time behavior should be identical and permit correction.

In yet another method embodying the principles of the present invention, the eddy current behavior is measured within an empty core holder. In this case, the behavior within the empty core holder is assumed to be constant with a sealed core holder containing a core sample.

A person of ordinary skill in the art would appreciate that applications of the principles of the present invention are not limited to core holders for rock core samples. Another application includes pipes where the pressure is exerted by the fluid in the pipe and the ends of the pipe are open to permit flow.

Further, MR and MRI measurements with magnetic field gradients can be used to study processes in different types of cells, for example, sealed vessels with elevated pressure and temperature conditions appropriate to permit industrial chemical reactions, sealed vessels at moderate pressure (less than 100 atm and 100° C.) resulting in the formation of supercritical fluids for some gases (e.g. supercritical $CO_2$ used for industrial processes such as dry cleaning and caffeine removal from coffee beans); autoclaves (e.g. sealed moderate pressure vessels heated to above 100° C.) used for sterilization and other industrial processes including polymer composite forming; vessels with adequate pressure and temperature capabilities used to study carbon capture and storage of $CO_2$ underground in porous reservoir rocks; and vessels with adequate pressure and temperature capabilities (less than 100 atm and 4° C.) used to study methane hydrate formation and pore occupancy of methane hydrate in sand and rock beds.

A pressure vessel embodying the principles of the present invention can have a generally cylindrical outer wall similar to the casing 2 in FIG. 2 and can be, for example, a pipe.

Figure 3:
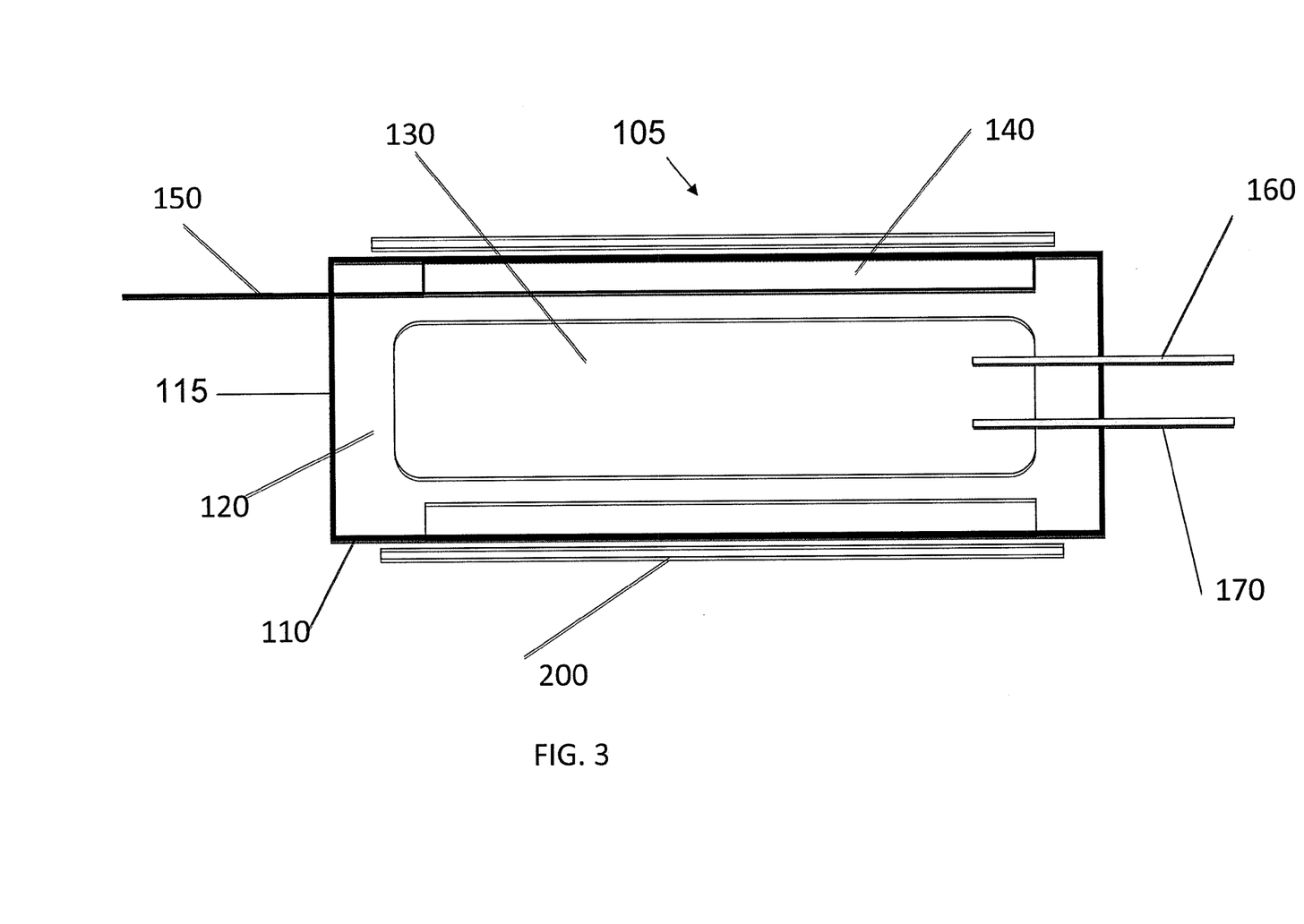
FIG. 3 is a side view of a pressure vessel embodying the principles of the present invention.
Figure 4:
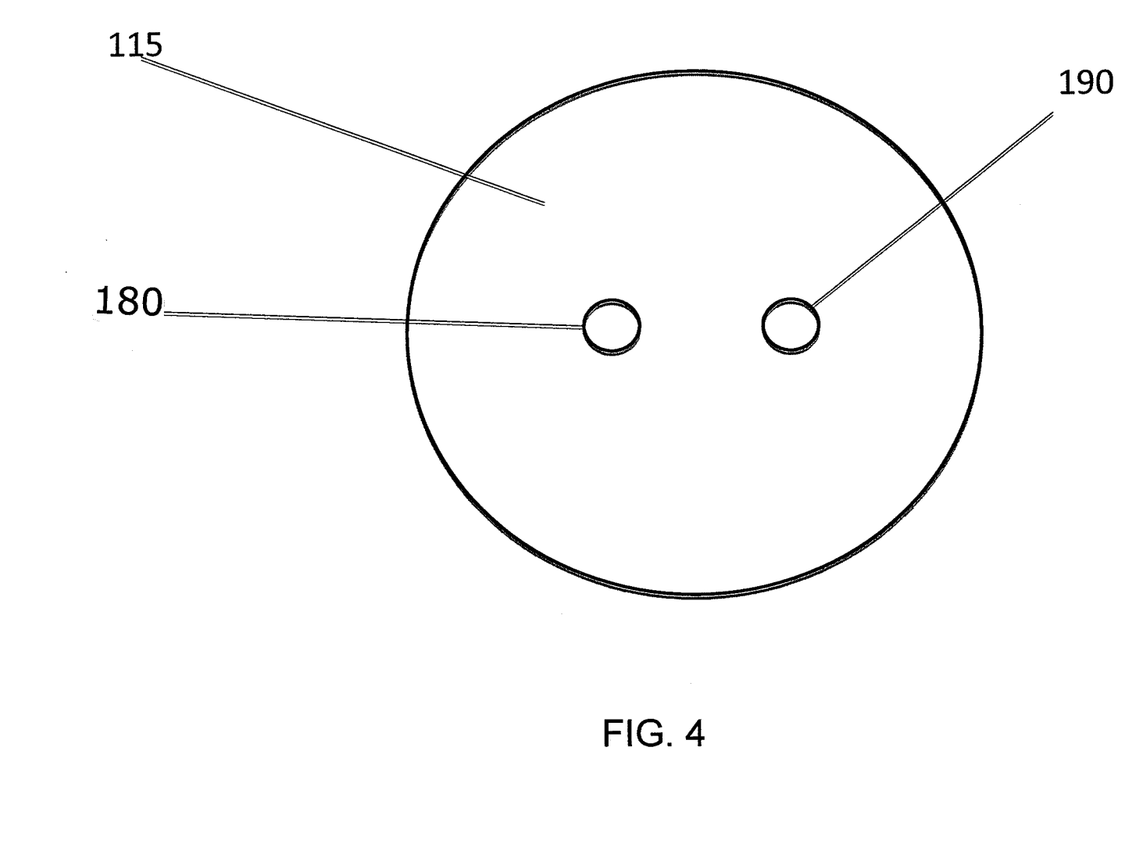
FIG. 4 is an end view from the right hand side of the pressure vessel of FIG. 3.

Referring to FIGS. 3 and 4, a pressure vessel embodying the principles of the present invention is depicted. The vessel indicated generally at 105 has a cylindrical metal outer wall 110 with a removable end wall 115, an epoxy filler 120 formed on the inside wall of the vessel 105 and which defines a sample space 130. An RF probe 140 between the outer wall 110 and the filler 120 surrounds the sample space. The probe 140 may be a coil winding or other suitable structure. The probe 140 has a lead 150 for connecting the probe to suitable NMR equipment (not shown) of the type described with respect to FIG. 7. An inlet tube 160 and outlet tube 170 are provided through openings 180 and 190 in the end wall 115 for passing fluids in and out of the sample space. A heating/cooling element 200 wraps around the vessel 105 for heating and/or cooling the vessel and in turn the sample space as needed. The heating cooling element 200 can be heating tape, a plastic sleeve with heated or cooled liquid circulated therein, or other suitable heating/cooling element.

Figure 5:
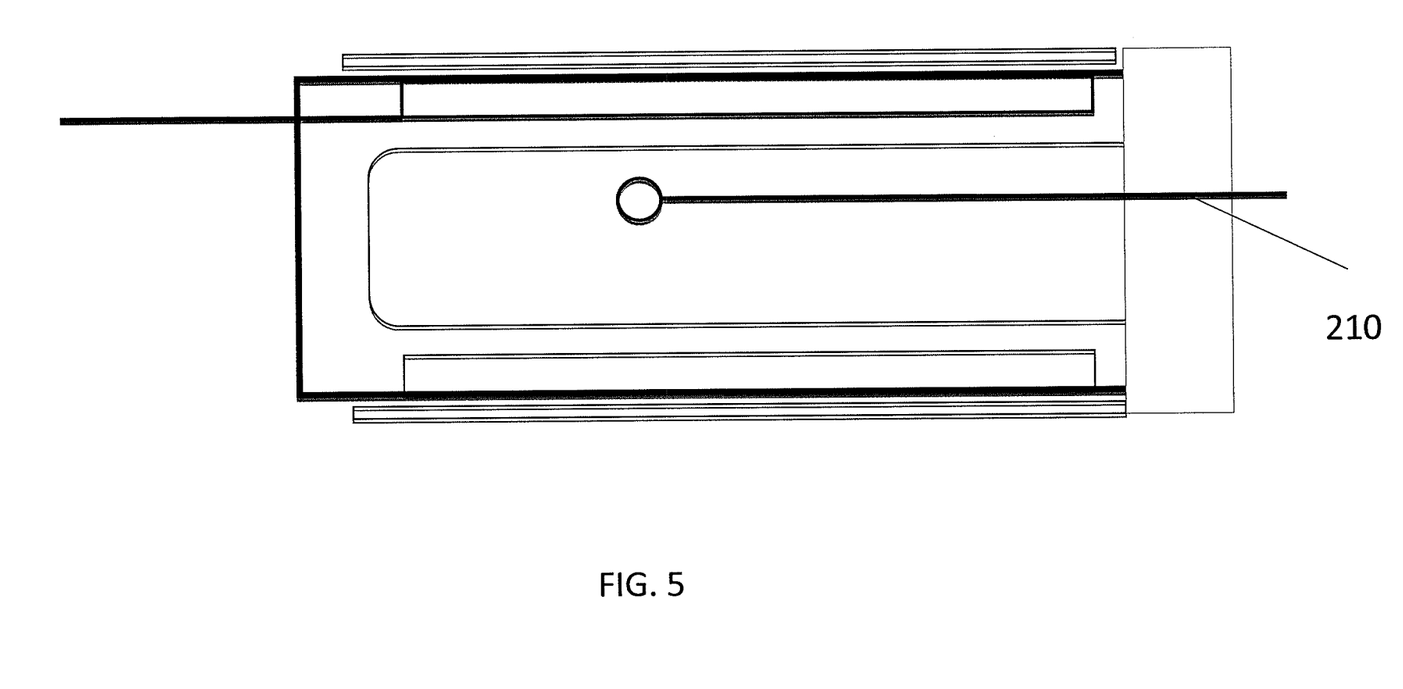
FIG. 5 is a side view of the pressure vessel of FIG. 3 with one end open and an MFGM probe inserted.

Referring to FIG. 5, the eddy current measurements within the sample space can be made with an MFGM probe of the type described herein and one embodiment of which is shown in FIG. 7. The probe 210 can be inserted into the sample space by removing the end wall 115. The MFGM probe 210 is connected to suitable NMR equipment (not shown). Eddy current measurements are generally taken when the sample space is empty and does not contain a sample.

Figure 6:
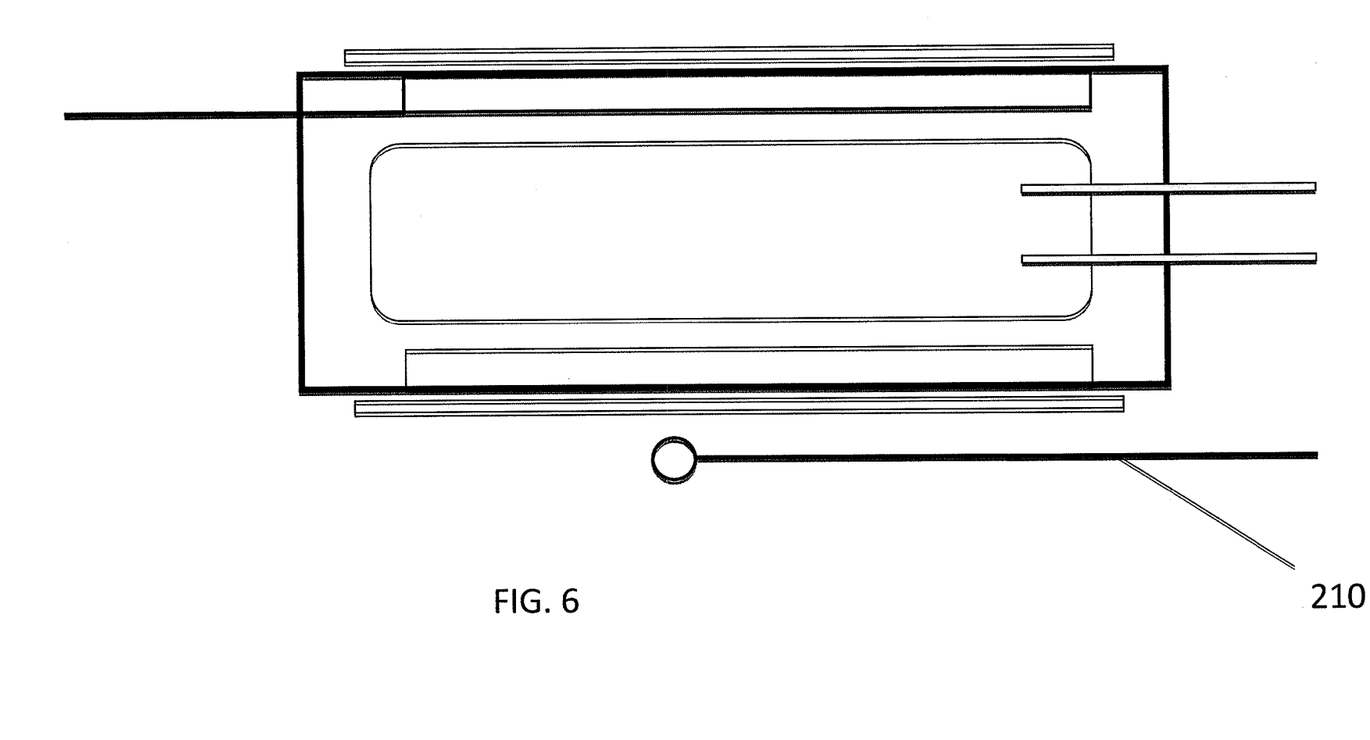
FIG. 6 is a side view of the pressure vessel of FIG. 3 with an MFGM probe along side.

Referring to FIG. 6, in another method embodying the principles of the invention, the probe 210 can be placed outside of the vessel 105 when making $B_0(t)$ eddy current measurements.

Pressurization of the sample space in the pressure vessel is achieved by conducting a liquid or gas into the sample space through a conduit in the epoxy.

The principles of the present invention can also be applied to core holders and vessels (including pressure vessels) where non-gradient MR measurements such as free induction decays, CPMG echo measurements, $T_1$ measurements and all manner of conventional non-gradient, non-MRI measurements are carried out on samples in a core holder or vessel embodying the principles of the invention.

Figure 8A:
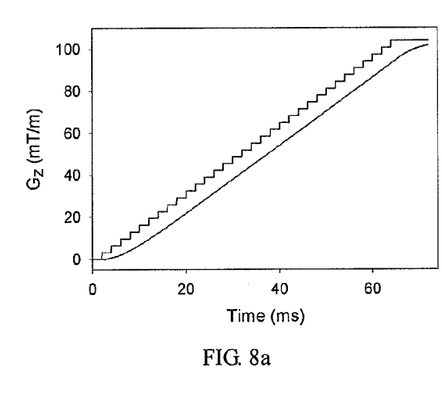
FIGS. 8a and 8b are graphs of gradient measurements and the associated k space data points in a model pressure vessel embodying the principles of the present invention.
Figure 8B:
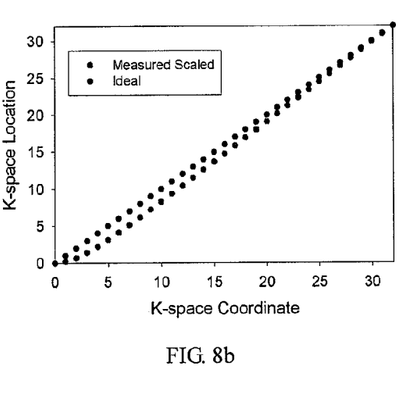

FIG. 8(a) shows dhk SPRITE gradient waveforms (the positive interleave) measured [ideal Gz(—), measured Gz(—).] using a small MFGM probe, positioned inside the MRI RF coil, which was inside a model aluminum pressure vessel. Note that the eddy currents reach a steady state after about 10 ms. The gradient should be switching abruptly, and should follow the ideal waveform, but it is significantly corrupted by eddy currents in the metal vessel. FIG. 8(b) Shows the calculated k-space coordinates from FIG. 8(a) compared with the ideal k-space locations. The real k-space coordinates have been pinched in toward the k-space centre due to the eddy current effect on switching. The k space data points are no longer equidistantly spaced. Knowledge of the true k space data coordinates permits a variety of possible image reconstruction strategies.

Figure 9A:
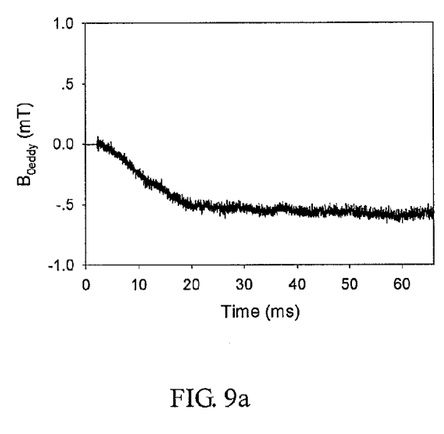
FIGS. 9a and 9b are graphs of Bo eddy currents and Bo phase shifts respectively of the pressure vessel of FIGS. 8a and 8b.
Figure 9B:
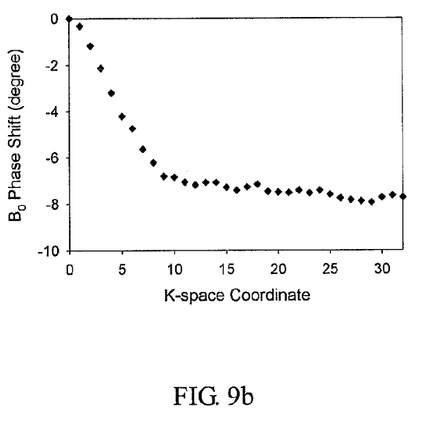

The aluminum cylinder representing the pressure vessel is close to centered in the gradient set. This symmetry reduces the severity of spatially uniform $B_0(t)$ field shift eddy currents. FIG. 9(a) Shows minor $B_0$ eddy currents. for data corresponding to the experiment of FIGS. 8a and 8b. The $B_0$ phase shifts, shown in FIG. 9(b), were calculated from measurements of FIG. 9(a). The $B_0$ eddy currents will also cause severe image artifacts without appropriate correction. The $B_0$ phase shifts of k-space data due to $B_0$ eddy currents can be completely removed based on MFGM measurements as shown above.

The invention claimed is:

1. A core holder for containing a reservoir rock core plug sample for NMR or MRI measurement comprising:
    a non-magnetic metallic casing having sufficient tensile strength to withstand being pressurized to an underground formation pressure, comprising
        a cylindrical wall and end closures for closing the ends of the casing wherein at least one of the end closures is removable to provide access to the inside of the casing,
        a containment sleeve within the casing wherein at least part of the containment sleeve and at least part of the end closures define a sample space within the core holder wherein the sample space is sized to accommodate a reservoir rock core plug sample,
        an inlet and an outlet in the core holder for permitting the passage of fluid in and out of the sample space, a void space for containing a fluid, the void space occupying an area between the containment sleeve and the cylindrical wall and isolated from the sample space, an inlet opening in the core holder for introducing a fluid into the void space and wherein the inlet opening is connectable to a device for pressurizing a fluid in the void space to an underground formation pressure, whereby a reservoir rock core plug sample in the sample space may be pressurized to an underground formation pressure, and a radio frequency probe enclosed within the core holder, the probe having a configuration such that a reservoir rock core plug sample placed in the sample space can at least be partially enclosed by the probe and wherein the probe is connectable to an NMR or MRI apparatus.

2. The core holder of claim 1 wherein the probe conforms to the cylindrical wall of the casing.

3. The core holder of claim 1 further comprising a heating or cooling device for controlling the temperature in the sample space and wherein the heating or cooling device is located on the outside of the casing.

4. The core holder of claim 1 adapted to be spun in a centrifuge.

5. The core holder of claim 1 wherein the radio frequency probe has a configuration selected from the group consisting of a solenoid, a saddle coil and a bird cage.

6. The core holder of claim 1 wherein the radio frequency probe is configured to generate an alternating magnetic field which is parallel to the longitudinal axis of the cylindrical wall and wherein the NMR or MRI apparatus comprises a permanent magnet wherein the longitudinal axis of the permanent magnet is substantially parallel to the longitudinal axis of the cylindrical inner wall.

7. The core holder of claim 1 wherein the radio frequency probe is configured to generate an alternating magnetic field which is perpendicular to the longitudinal axis of the cylindrical wall and wherein the NMR or MRI apparatus comprises a superconducting magnet wherein the longitudinal axis of the superconducting magnet is substantially parallel to the longitudinal axis of the cylindrical inner wall.

* * * * *